(12) United States Patent
Zhang

(10) Patent No.: US 12,550,495 B2
(45) Date of Patent: Feb. 10, 2026

(54) FLIP LED CHIP AND MANUFACTURING METHOD THEREFOR

(71) Applicant: XIAMEN SILAN ADVANCED COMPOUND SEMICONDUCTOR CO. LTD, Xiamen (CN)

(72) Inventor: Xiaoping Zhang, Xiamen (CN)

(73) Assignee: XIAMEN SILAN ADVANCED COMPOUND SEMICONDUCTOR CO., LTD, Xiamen (CN)

( * ) Notice: Subject to any disclaimer, the term of this patent is extended or adjusted under 35 U.S.C. 154(b) by 799 days.

(21) Appl. No.: 17/778,530

(22) PCT Filed: May 6, 2020

(86) PCT No.: PCT/CN2020/088648
§ 371 (c)(1),
(2) Date: May 20, 2022

(87) PCT Pub. No.: WO2021/098156
PCT Pub. Date: May 27, 2021

(65) Prior Publication Data
US 2023/0008993 A1    Jan. 12, 2023

(30) Foreign Application Priority Data
Nov. 20, 2019  (CN) .......................... 201911143705.8

(51) Int. Cl.
*H10H 20/83*     (2025.01)
*H10H 20/816*   (2025.01)
(Continued)

(52) U.S. Cl.
CPC ........ *H10H 20/841* (2025.01); *H10H 20/816* (2025.01); *H10H 20/825* (2025.01); *H10H 20/8312* (2025.01); *H10H 20/857* (2025.01)

(58) Field of Classification Search
CPC ............... H10H 20/841; H10H 20/816; H10H 20/825; H10H 20/8312; H10H 20/857; H10H 20/032; H10H 20/034; H10H 20/84
(Continued)

(56) References Cited

U.S. PATENT DOCUMENTS 6,483,196 B1 *  11/2002  Wojnarowski ....... H10H 20/819
                                                                257/E33.059
7,274,040 B2 *   9/2007  Sun ....................... H10H 20/831
                                                                        257/97

(Continued)

FOREIGN PATENT DOCUMENTS

CN       102646765 A      8/2012
CN       102683540 A      9/2012
(Continued)

OTHER PUBLICATIONS

International Search Report with English translation and Written Opinion for International Application No. PCT/CN2020/088648, date of mailing Jul. 9, 2020, 9 pages.

(Continued)

*Primary Examiner* — Sheikh Maruf
(74) *Attorney, Agent, or Firm* — Westman, Champlin & Koehler, P.A.

(57) ABSTRACT

Disclosed is a flip-chip LED, comprising: an epitaxial layer on a surface of a substrate, and comprising a first semiconductor layer, a light emitting layer and a second semiconductor layer arranged in sequence from bottom to top, wherein a mesa in the epitaxial layer has an upper surface provided by the second semiconductor layer, a lower surface provided by the first semiconductor layer, and a side surface connecting the upper surface and the lower surface; a first insulating layer covering the side surface of the mesa, part of the upper surface and part of the lower surface; and a reflective layer on the second semiconductor layer. A manu- (Continued)

facturing method of a flip-chip LED is also provided, an insulating layer covers the side surface of the mesa to protect the mesa immediately after the mesa is formed, to avoid abnormal phenomena and improve yield of the flip-chip LED.

22 Claims, 5 Drawing Sheets

(51) Int. Cl.
  *H10H 20/825* (2025.01)
  *H10H 20/831* (2025.01)
  *H10H 20/841* (2025.01)
  *H10H 20/857* (2025.01)

(58) Field of Classification Search
  USPC .......................................................... 257/79
  See application file for complete search history.

(56) References Cited

U.S. PATENT DOCUMENTS

| | | | |
|---|---|---|---|
| 10,381,519 B2 | 8/2019 | Seo et al. | |
| 10,535,804 B2 | 1/2020 | Yim | |
| 2003/0025212 A1* | 2/2003 | Bhat | H10H 20/819 |
| | | | 257/E33.068 |
| 2004/0211972 A1* | 10/2004 | Du | H10H 20/018 |
| | | | 257/99 |
| 2013/0277641 A1* | 10/2013 | Li | H10H 20/856 |
| | | | 257/13 |
| 2014/0312369 A1 | 10/2014 | Yoon et al. | |
| 2015/0115276 A1* | 4/2015 | Kuo | H10H 20/8162 |
| | | | 257/76 |
| 2016/0197238 A1* | 7/2016 | Jeong | H10H 20/812 |
| | | | 257/98 |
| 2017/0098746 A1* | 4/2017 | Bergmann | H10H 20/857 |
| 2017/0170364 A1* | 6/2017 | Jeon | H10H 20/841 |
| 2018/0026163 A1 | 1/2018 | Seo et al. | |
| 2018/0047866 A1* | 2/2018 | Park | H10H 20/825 |
| 2018/0090645 A1* | 3/2018 | Nelson | H10H 20/018 |
| 2018/0130926 A1* | 5/2018 | Huang | H10H 20/841 |
| 2018/0138364 A1* | 5/2018 | Zhang | H10H 20/841 |
| 2018/0212111 A1 | 7/2018 | Yim | |
| 2018/0337222 A1* | 11/2018 | Wang | H10K 59/35 |
| 2019/0013441 A1* | 1/2019 | Hong | H10H 20/816 |
| 2019/0019918 A1* | 1/2019 | Vaufrey | H10H 20/825 |
| 2019/0035845 A1* | 1/2019 | Zhang | H10H 20/816 |
| 2019/0081208 A1* | 3/2019 | Choi | H10H 20/83 |
| 2019/0081214 A1* | 3/2019 | Meng | H10H 20/84 |
| 2019/0115497 A1* | 4/2019 | Zhang | H10H 20/812 |
| 2019/0214374 A1* | 7/2019 | Huang | H01L 25/0753 |
| 2019/0237630 A1* | 8/2019 | Check | H10H 20/833 |
| 2019/0280157 A1* | 9/2019 | Hu | H10H 20/825 |
| 2020/0098820 A1* | 3/2020 | Zhang | H10H 20/831 |
| 2020/0176636 A1* | 6/2020 | Chae | H10H 20/831 |
| 2021/0335902 A1* | 10/2021 | Al | H10K 71/40 |

FOREIGN PATENT DOCUMENTS

| | | |
|---|---|---|
| CN | 103119735 A | 5/2013 |
| CN | 107293623 A | 10/2017 |
| CN | 107431103 A | 12/2017 |
| CN | 107924967 A | 4/2018 |
| CN | 108922950 A | 11/2018 |
| CN | 109216161 A | 1/2019 |
| CN | 110931619 A | 3/2020 |

OTHER PUBLICATIONS

First Office Action, including Search Report, for Chinese Patent Application No. 201911143705.8, dated Jul. 27, 2020, 21 pages.
Second Office Action, including Search Report, for Chinese Patent Application No. 201911143705.8, dated Jan. 25, 2021, 10 pages.

* cited by examiner

FLIP LED CHIP AND MANUFACTURING METHOD THEREFOR

CROSS-REFERENCE TO RELATED APPLICATION

This application is a Section 371 National Stage application of International Application No. PCT/CN2020/088648, which was filed on May 6, 2020 and published as WO 2021/098156 A1, on May 27, 2021, not in English, which claims priority to Chinese patent application No. CN 201911143705.8, filed on Nov. 20, 2019, and entitled "Flip-chip LED and Manufacturing Method Thereof", the entire contents of which are incorporated herein by reference in their entireties.

FIELD OF THE DISCLOSURE

The present disclosure relates to a technical field of semiconductor manufacturing, and in particular, to a flip-chip LED (light emitting diode) and a manufacturing method of a flip-chip LED.

DESCRIPTION OF THE RELATED ART

After more than 20 years of development since GaN-based LED was first commercialized in the early 1990s, GaN-based LED has been widely used in indoor and outdoor display screens, illumination sources for projection display, backlight sources, landscape lighting, advertising lighting, traffic instruction lighting and other fields, and is known as the most competitive new generation of solid-state lighting source in the 21st century. However, for LED, it is very important to improve its luminous brightness, before it can replace traditional light sources to enter high-end lighting fields.

A basic structure of a flip-chip LED (having an electrode surface and a light-emitting surface at opposite sides) is formed by soldering a normal LED (having an electrode surface and a light-emitting surface at a same side) in a flip-chip form on a substrate with good electrical conductivity and thermal conductivity, making an epitaxial layer with concentrated heat generation closer to a heat dissipation substrate, so that most heat can be removed through the substrate instead of through a sapphire growth substrate having poor heat dissipation, which alleviates heat dissipation problem of LED to a certain extent; additionally, a surface for light emitting of the flip-chip LED and a surface for pads are two opposite surfaces, thus preventing the light emitting area of the LED from being influenced by the LED pads, that is, under a condition that an area of the LED is determined, compared with a horizontal LED, the flip-chip LED has a larger luminous area and higher luminous efficiency; at the same time, the flip-chip LED can realize chip-level packaging without gold wire; to sum up, the flip-chip LED has been paid more and more attention and favored by LED field, especially in medium and high power application market, because of its advantage, such as good heat dissipation, large light emitting area and supporting the realization on chip-level packaging.

However, according to the prior art, steps for manufacturing a flip-chip LED include: successively forming an N-type gallium nitride layer (N—GaN layer), a light emitting layer (i.e., a PN junction) and a P-type gallium nitride layer (P—GaN layer) on a substrate, in order to form an epitaxial layer; forming a mesa by performing ICP (Inductively Coupled Plasma) etching process from the P—GaN layer to expose a portion of the N—GaN layer. After the ICP etching process is performed, the mesa is always being exposed to the outside before it can be protected by an insulating protective layer formed after two subsequent processes for forming a reflective layer and a metal protective layer are performed, so that the mesa is easy to be contaminated by some pollutants, such as silver metal of the reflective layer, photoresist, photoresist stripper, etc., thus affecting electrical parameters, such as cut-in voltage $VF_{in}$, leakage current IR and electro static discharge (ESD), of the LED.

SUMMARY OF THE DISCLOSURE

In view of the above-mentioned problems, an objective of the present disclosure is to provide a flip-chip LED and a manufacturing method thereof, wherein after a mesa is formed on an epitaxial layer, an insulating layer is immediately covered on a side surface of the mesa to prevent electric leakage phenomenon from being caused by contamination of metal, photoresist, photoresist stripper, and the like on the side surface of the mesa.

According to a first aspect of the present disclosure, a flip-chip LED is provided, and comprises:
  a substrate;
  an epitaxial layer, which is located on a surface of the substrate, and comprises a first semiconductor layer, a light emitting layer and a second semiconductor layer arranged in sequence from bottom to top;
  a mesa, located in the epitaxial layer, wherein an upper surface of the mesa is provided by the second semiconductor layer, a lower surface of the mesa is provided by the first semiconductor layer, and the upper surface and the lower surface are connected through a side surface of the mesa formed between the upper surface and the lower surface;
  a first insulating layer covering the side surface of the mesa, part of the upper surface and part of the lower surface; and
  a reflective layer, located on the second semiconductor layer.

In some embodiments, a distance between the reflective layer and the side surface of the mesa adjacent to the reflective layer ranges from 0 um to 6 um.

In some embodiments, the flip-chip LED further comprises:
  a current spreading layer, located on the reflective layer;
  a first electrode, electrically connected with the first semiconductor layer;
  a second electrode, which is isolated from the first electrode, located on the current spreading layer, and electrically connected to the second semiconductor layer.

In some embodiments, a thickness of the current spreading layer ranges from 0.5 um to 3 um.

In some embodiments, the current spreading layer covers part of the first insulating layer.

In some embodiments, the reflective layer and the current spreading layer each cover part of the first insulating layer.

In some embodiments, the first insulating layer has first openings respectively exposing part of the first semiconductor layer and part of the second semiconductor layer.

In some embodiments, a thickness of the first insulating layer ranges from 0.01 um to 10 um.

In some embodiments, material of the first insulating layer comprises at least one of silicon oxide and silicon nitride.

In some embodiments, material of the reflective layer comprises at least one of silver, aluminum and indium tin oxide.

In some embodiments, material of the current spreading layer comprises at least one of titanium, platinum, silver, aluminum, nickel, chromium, and gold.

In some embodiments, a thickness of the reflective layer ranges from 0.1 um to 2 um.

In some embodiments, the flip-chip LED further comprises:
a second insulating layer, located on the first insulating layer and the current spreading layer,
wherein the second insulating layer has second openings respectively exposing part of the first semiconductor layer and part of the current spreading layer.

In some embodiments, a thickness of the second insulating layer ranges from 0.01 um to 10 um, and material of the second insulating layer comprises at least one of silicon oxide and silicon nitride.

In some embodiments, the flip-chip LED further comprises:
a wiring layer, which is located on the second insulating layer, covers an exposed portion of first semiconductor layer and an exposed portion of the current spreading layer, and is electrically connected with the first semiconductor layer and the current spreading layer, respectively;
wherein the wiring layer comprises a first metal layer and a second metal layer isolated from each other, the first metal layer is electrically connected with the first semiconductor layer;
and the second metal layer is located on the current spreading layer and electrically connected with the second semiconductor layer.

In some embodiments, the first metal layer and the second metal layer are separated by a distance ranging from 5 um to 100 um in a horizontal direction.

In some embodiments, a thickness of the wiring layer ranges from 0.5 um to 3 um, and material of the wiring layer comprises at least one of titanium, platinum, silver, aluminum, nickel, chromium, and gold.

In some embodiments, the flip-chip LED further comprises:
a third insulating layer, located on the first metal layer and the second metal layer;
wherein, the third insulating layer has third openings, which respectively expose part of the first metal layer and part of the second metal layer.

In some embodiments, the first electrode is located on the third insulating layer and electrically connected with the first metal layer through a corresponding one of the third openings,
and the second electrode is located on the third insulating layer and electrically connected with the second metal layer through another one of the third openings.

In some embodiments, a thickness of the third insulating layer ranges from 0.01 um to 10 um, and material of the third insulating layer comprises at least one of silicon oxide and silicon nitride.

In some embodiments, material of the first electrode and the second electrode is at least one of titanium, platinum, silver, aluminum, nickel, chromium, gold, and gold-tin alloy.

In some embodiments, the first electrode and the second electrode are separated by a distance ranging from 10 um to 300 um in a horizontal direction.

In some embodiments, the first semiconductor layer is an N-type gallium nitride layer, the second semiconductor layer is a P-type gallium nitride layer, the first electrode is an N-type electrode, and the second electrode is a P-type electrode.

According to a second aspect of the present disclosure, a manufacturing method of a flip-chip LED is provided and comprises:
forming an epitaxial layer on a substrate, wherein the epitaxial layer comprises a first semiconductor layer, a light emitting layer and a second semiconductor layer arranged in sequence from bottom to top;
etching a portion of the epitaxial layer to form a mesa in the epitaxial layer, wherein an upper surface of the mesa is provided by the second semiconductor layer, a lower surface of the mesa is provided by the first semiconductor layer, and the upper surface and the lower surface are connected through a side surface of the mesa formed between the upper surface and the lower surface of the mesa;
forming a first insulating layer on the side surface of the mesa, part of the upper surface and part of the lower surface; and
forming a reflective layer on the second semiconductor layer.

In some embodiments, a distance between the reflective layer and the side surface of the mesa adjacent to the reflective layer is 0 um to 6 um.

In some embodiments, the method further comprises:
forming a current spreading layer on the reflective layer; and
forming a first electrode which is electrically connected to the first semiconductor layer, and forming a second electrode which is located on the current spreading layer and electrically connected to the second semiconductor layer, wherein the first electrode and the second electrode are isolated from each other.

In some embodiments, a thickness of the current spreading layer ranges from 0.5 um to 3 um.

In some embodiments, the current spreading layer covers part of the first insulating layer.

In some embodiments, the reflective layer and the current spreading layer each cover part of the first insulating layer.

In some embodiments, step of forming the first insulating layer on the side surface of the mesa, part of the upper surface and part of the lower surface comprises:
forming the first insulating layer on the epitaxial layer;
etching the first insulating layer to form first openings exposing part of the first semiconductor layer and part of the second semiconductor layer, respectively.

In some embodiments, the mesa is formed by ICP etching or wet etching.

In some embodiments, a thickness of the first insulating layer ranges from 0.01 um to 10 um.

In some embodiments, material of the first insulating layer comprises at least one of silicon oxide and silicon nitride.

In some embodiments, material of the reflective layer comprises at least one of silver, aluminum, and indium tin oxide.

In some embodiments, material of the current spreading layer comprises at least one of titanium, platinum, silver, aluminum, nickel, chromium, and gold.

In some embodiments, a thickness of the reflective layer ranges from 0.1 um to 2 um.

In some embodiments, the method further comprises:
forming a second insulating layer on the first insulating layer and the current spreading layer.

In some embodiments, the method further comprises:
etching the second insulating layer to form second openings respectively exposing part of the first semiconductor layer and part of the current spreading layer.

In some embodiments, a thickness of the second insulating layer ranges from 0.01 um to 10 um, and material of the second insulating layer comprises at least one of silicon oxide and silicon nitride.

In some embodiments, the method further comprises:
forming a wiring layer on the second insulating layer, wherein an exposed portion of the first semiconductor layer and an exposed portion of the current spreading layer are covered by the wiring layer which is electrically connected to the first semiconductor layer and the current spreading layer, respectively; wherein the wiring layer comprises a first metal layer and a second metal layer isolated from each other, the first metal layer is electrically connected with the first semiconductor layer,
and the second metal layer is located on the current spreading layer and electrically connected with the second semiconductor layer.

In some embodiments, the first metal layer and the second metal layer are separated by a distance ranging from 5 um to 100 um in a horizontal direction.

In some embodiments, a thickness of the wiring layer ranges from 0.5 um to 3 um, and material of the wiring layer comprises at least one of titanium, platinum, silver, aluminum, nickel, chromium, and gold.

In some embodiments, the method further comprises:
forming a third insulating layer on the wiring layer;
etching the third insulating layer to form third openings which respectively expose part of the first metal layer and part of the second metal layer;
wherein, the first electrode is located on the third insulating layer and electrically connected with the first metal layer through a corresponding one of the third openings,
and the second electrode is located on the third insulating layer and electrically connected with the second metal layer through another one of the third openings.

In some embodiments, a thickness of the third insulating layer ranges from 0.01 um to 10 um, and material of the third insulating layer comprises at least one of silicon oxide and silicon nitride.

In some embodiments, material of the first electrode and the second electrode is at least one of titanium, platinum, silver, aluminum, nickel, chromium, gold, and gold-tin alloy.

In some embodiments, the first electrode and the second electrode are separated by a distance ranging from 10 um to 300 um in a horizontal direction.

In some embodiments, the first semiconductor layer is an N-type gallium nitride layer, the second semiconductor layer is a P-type gallium nitride layer, the first electrode is an N-type electrode, and the second electrode is a P-type electrode.

The present disclosure provides a flip-chip LED and a manufacturing method of a flip-chip LED, wherein an insulating layer covers the side surface of the mesa to protect the mesa immediately after the mesa is formed by etching, so that the mesa can be exposed to the air just for a short time, and be prevented from being contaminated by pollutants such as metal (e.g., silver, etc.), photoresist, photoresist stripper and the like during subsequent processes, thus abnormal phenomena, such as electric leakage and poor ESD performance, can be avoided, and yield of the flip-chip LED can be improved.

BRIEF DESCRIPTION OF THE DRAWINGS

The above and other objects, features and advantages of the present invention will become more apparent from following descriptions of embodiments of the present disclosure with reference to the accompanying drawings, in which.

DETAILED DESCRIPTION OF EMBODIMENTS OF THE DISCLOSURE

Figure 1:
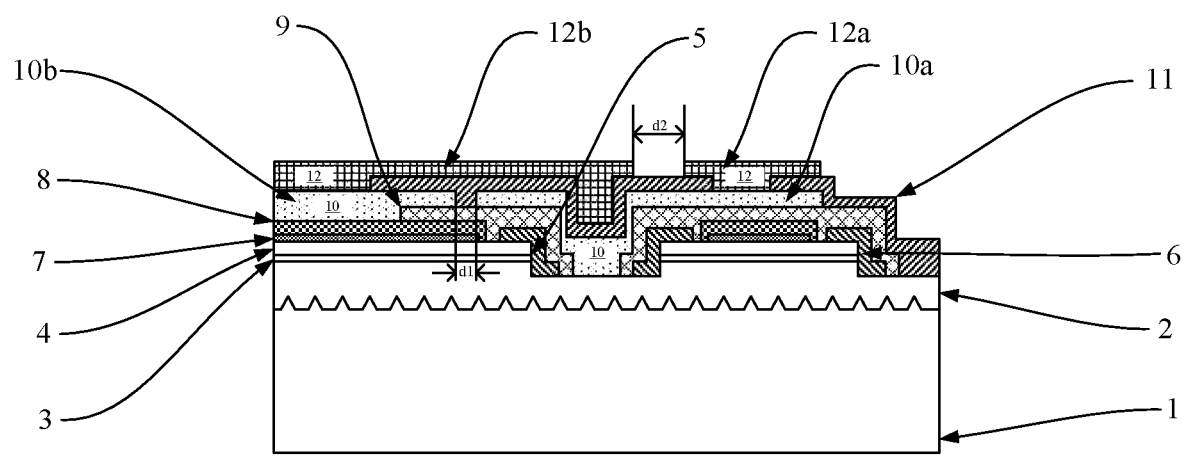
FIG. 1 shows a schematic structural diagram of a flip-chip LED according to a first embodiment of the present disclosure.

Various embodiments of the present invention will be described in more detail below with reference to the accompanying drawings. Throughout the various figures, like elements are denoted by same or similar reference numerals. For the sake of clarity, various parts in the drawings are not drawn to scale.

Specific embodiments of the present disclosure are described in further detail below with reference to the accompanying drawings and embodiments.

FIG. 1 shows a schematic structural diagram of a flip-chip LED according to a first embodiment of the present disclosure. As shown in FIG. 1, the flip-chip LED comprises: a substrate 1; an epitaxial layer which is located on a surface of the substrate 1 and comprises a first semiconductor layer 2, a light emitting layer 3, and a second semiconductor layer 4 arranged in sequence from bottom to top; a mesa located in the epitaxial layer, wherein an upper surface of the mesa is provided by the second semiconductor layer 4, a lower surface of the mesa is provided by the first semiconductor layer 2, and the upper surface and the lower surface are connected through a side surface 5 of the mesa formed between the upper surface and the lower surface of the mesa; a first insulating layer 6 which covers the side surface of the mesa, part of the upper surface and part of the lower surface, and exposes a portion of the first semiconductor layer 2 and a portion of the second semiconductor layer 4; a reflective layer 7 located on the second semiconductor layer 4; a current expanding layer 8 located on the reflective layer 7; a first electrode 12a electrically connected to the exposed portion of the first semiconductor layer 2; a second electrode 12b, which is isolated from the first electrode, located on the current spreading layer 8 and electrically connected to the second semiconductor layer 4.

Specifically, the substrate 1 may be made of sapphire, Si (silicon), SiC (silicon carbide), GaN (gallium nitride), ZnO (zinc oxide), etc. In this embodiment, the substrate 1 is a sapphire ($Al_2O_3$) substrate having high light transmittance preferably. Further, the substrate 1 is a patterned sapphire substrate (PSS), a standard photolithography process is performed to etch out a pattern of a mask on the surface of the substrate 1, and then the substrate 1 is etched by using ICP etching technology, so that patterned grooves are formed on the surface of the substrate 1 to improve luminous efficiency.

The material of the epitaxial layer is selected from any one or a combination of several of AlN, GaN, AlGaN, InGaN and AlInGaN, and in particular, a main material of the epitaxial layer is GaN preferably. More specifically, the epitaxial layer can be fabricated on the substrate by any one of existing known methods such as vapor deposition, evaporation, etc. In the epitaxial layer, the first semiconductor layer 2 is an N-type semiconductor layer, which is located on the substrate 1, and the material of the first semiconductor layer 2 is GaN. The light emitting layer 3 is located on the first semiconductor layer 2, and the light emitting layer 3 is constructed as a multiple quantum well layer, and the material of the quantum well layer is any one or a combination of several of AlN, GaN, AlGaN, InGaN and AlInGaN. The second semiconductor layer 4 is a P-type semiconductor layer located on the light emitting layer 3, and the material of the second semiconductor layer 4 is also GaN.

Further, the epitaxial layer is provided with a mesa. Preferably, the mesa is formed by performing photolithography process, wherein an MESA graphic of light emitting area is generated, and the mesa is formed by etching the epitaxial layer by use of an ICP (Induced Coupled Plasma) etching equipment, or by etching the epitaxial layer with KOH solution or a mixed solution of $H_2SO_4$ and $H_3PO_4$ with a ratio of $H_2SO_4:H_3PO_4=3:1$. The etching stops at a depth deeper than the light emitting layer 3, i.e., multiple quantum well (MQW) layer, so that part of the first semiconductor layer 2 is exposed, the mesa (seeing from a side view) is formed by etching, wherein the mesa comprises an upper surface and a lower surface, the upper surface is provided by the second semiconductor layer, the lower surface is provided by the first semiconductor layer, and the upper surface and the lower surface are connected through a side surface 5 of the mesa formed between the upper surface and the lower surface of the mesa.

Further, the first insulating layer 6 covers on the side surface of the mesa 5, part of the upper surface and part of the lower surface. Preferably, the first insulating layer 6 is coated by performing PECVD (Plasma Enhanced Chemical Vapor Deposition) process, then a mask is made by using positive photoresist, and first openings are formed by etching the first insulating layer 6 by use of an ICP (Inductive Coupled Plasma) etching equipment or by etching the first insulating layer 6 with BOE solution or HF solution, so that part of the first semiconductor layer 2 and part of the second semiconductor layer 4 are respectively exposed by the first openings. A thickness of the first insulating layer 6 ranges from 0.01 um to 10 um, and in a further preferred embodiment, the first insulating layer 6 has a thickness of 0.5 um. The material of the first insulating layer 6 comprises at least one of silicon oxide and silicon nitride. In the prior art, the insulating layer here is a DBR layer, so that the cost of the flip-chip LED according to the present disclosure is relatively low compared with the prior art. A function of the first insulating layer is to protect the side surface of the mesa in advance from being polluted during long-term exposure to the air, thus avoiding failures of the cut-in voltage $VF_{in}$ and the leakage current IR.

The reflective layer 7 is located on the second semiconductor layer 4, covers part of the upper surface, and has a certain distance from the first insulating layer 6. The reflective layer 7 has a function of reflecting light, thus can reflect back the portion of light that is emitted towards the second semiconductor layer 4 from the light emitting layer 3. The reflective layer 7 comprises at least one of silver (Ag), aluminum (Al), and indium tin oxide (ITO), and preferably, the reflective layer 7 is a silver layer. Preferably, a mask pattern is formed by negative photoresist lithography process, and then a thin film with high reflectivity is grown by electron beam evaporation, sputtering, ALD (Atomic layer deposition), etc., to form the reflective layer 7, and finally the mask and the thin film on the mask are removed by lift-off process or other means. A thickness of the reflective layer 7 ranges from 0.1 um to 2 um, and in a preferred embodiment, the reflective layer 7 has a thickness of 0.15 um. The reflective layer 7 and the side surface of the mesa are separated by a distance ranging from 0 um to 6 um, which is a vertical spacing in the horizontal direction between the reflective layer 7 and the side surface of the mesa. Compared with the prior art which provides a large spacing between the reflective layer and the side surface of the mesa, since the first insulating layer is arranged in advance according to the present disclosure, the problem of pollution on the mesa is no longer needed to be considered, so that the distance between the reflective layer 7 and the side surface of the mesa can be greatly reduced, that is, the area of the reflective layer according to the present disclosure can be made larger, and better reflection effect can be realized at the same time.

The current spreading layer 8 is located on the reflective layer 7, covers the reflective layer 7 and part of the upper surface, and is separated from the first insulating layer 6 by a certain distance. The current spreading layer 8 protects the reflective layer 7, so as to avoid electric leakage caused by electron migration. Preferably, the mask pattern is formed by negative photoresist lithography process, and the current spreading layer 8 is grown by electron beam evaporation, sputtering, ALD, etc. Finally, the mask and the metal on the mask are removed by metal lift-off process and photoresist removing process. The material of the current spreading layer 8 comprises at least one of titanium (Ti), platinum (Pt), silver (Ag), aluminum (Al), nickel (Ni), chromium (Cr), and gold (Au). In addition to the function of protecting the reflective layer 7, the current spreading layer 8 also has a function of spreading current over its whole surface, so it is required to have a sufficient thickness. If the reflective layer is too thin, performance on current spreading may be poor. Preferably, the thickness of the current spreading layer 8 ranges from 0.5 um to 3 um, and in a further preferred embodiment, the current spreading layer 8 has a thickness of 1.4 um.

The first electrode 12a is electrically connected to a portion of the first semiconductor layer 2 which provides the lower surface of the mesa; the second electrode 12b is located on the current spreading layer 8 and is electrically connected to the second semiconductor layer 4 through the current spreading layer 8. A patterned mask is formed by negative photoresist lithography process, and then a conductive metal film, such as at least one of titanium (Ti), platinum (Pt), silver (Ag), aluminum (Al), nickel (Ni), chromium (Cr), gold (Au), and gold-tin alloy (AuSn), is grown by electron beam evaporation or sputtering, to form the first electrode 12a and the second electrode 12b. Finally, the mask and the conductive metal film on the mask are removed by performing metal lift-off process and photoresist removing process. The first electrode 12a is an N-type electrode and the second electrode 12b is a P-type electrode. The first electrode 12a and the second electrode 12b are isolated from each other and the distance d2 between the first electrode and the second electrode in the horizontal direction ranges from 10 um to 300 um.

In a preferred embodiment, the flip-chip LED further comprises a second insulating layer 9 located on the first insulating layer 6 and the current spreading layer 8, wherein the second insulating layer 9 has second openings respectively exposing the first semiconductor layer 2 at the lower surface of the mesa and the current spreading layer 8 at the upper surface of the mesa. The second insulating layer 9 is preferably coated by performing plasma enhanced chemical vapor deposition (PECVD) process, and then a mask is made by using positive photoresist, and the second insulating layer 9 is etched by use of an ICP (Inductive Coupled Plasma) etching equipment or by BOE solution or HF solution to form second openings. A thickness of the second insulating layer 9 ranges from 0.01 um to 10 um, and in a further preferred embodiment, the second insulating layer 9 has a thickness of 1 um. The material of the second insulating layer 9 comprises at least one of silicon oxide and silicon nitride. Since the first insulating layer protects the side surface of the mesa in advance, the second insulating layer serves to insulate and protect the current spreading layer.

In a preferred embodiment, the flip-chip LED further comprises a wiring layer 10, which is located on the second insulating layer 9, covers the exposed portion of the first semiconductor layer 2 and the exposed portion of the current spreading layer 8, and is electrically connected to the first semiconductor layer 2 and the current spreading layer 8, respectively. The wiring layer 10 comprises a first metal layer 10a and a second metal layer 10b isolated from each other, wherein the first metal layer 10a is electrically connected to the exposed portion of the first semiconductor layer 2, and the second metal layer 10b is located on the current spreading layer 8 and electrically connected to the second semiconductor layer 4. The first metal layer 10a and the second metal layer 10b are separated by a distance d1 ranging from 5 um to 100 um in the horizontal direction. A thickness of the wiring layer 10 ranges from 0.5 um to 3 um, and in a further preferred embodiment, the wiring layer 10 has a thickness of 1.4 um. The material of the wiring layer 10 comprises at least one of titanium (Ti), platinum (Pt), silver (Ag), aluminum (Al), nickel (Ni), chromium (Cr), and gold (Au).

In a preferred embodiment, the flip-chip LED further comprises a third insulating layer 11 located on the wiring layer 10. The third insulating layer 11 has third openings respectively exposing a portion of the first metal layer 10a and a portion of the second metal layer 10b. The first electrode 12a is located on the third insulating layer 11 and electrically connected with the first metal layer 10a through a corresponding one of the third openings. The second electrode 12b is located on the third insulating layer 11 and electrically connected to the second metal layer 10b through another one of the third openings. The third insulating layer 11 is preferably coated by performing plasma enhanced chemical vapor deposition (PECVD) process, then a mask is made by using positive photoresist, and the third insulating layer 11 is etched by use of an ICP (Induced Coupled Plasma) etching equipment or by BOE solution or HF solution, to form the third openings. The third insulating layer insulates and passivates the wiring layer 10. A thickness of the third insulating layer 11 ranges from 0.01 um to 10 um, and in a further preferred embodiment, the third insulating layer 11 has a thickness of 1 um. The material of the third insulating layer 11 comprises at least one of silicon oxide and silicon nitride.

According to the flip-chip LED provided by the first embodiment of the present disclosure, an insulating layer covers the side surface of the mesa to protect the mesa immediately after the mesa is formed by etching, so that the mesa can be exposed to the air just for a short time, and be prevented from being contaminated by pollutants, such as metal, photoresist, photoresist stripper and the like, during subsequent processes, thus abnormal phenomena, such as electric leakage and poor ESD performance, can be avoided, and yield of the flip-chip LED can be improved.

FIGS. 2 to 10 show cross-sectional views of different stages of a manufacturing method of a flip-chip LED according to an embodiment of the present disclosure. Referring to FIGS. 2 to 10, the manufacturing method of the flip-chip LED comprises following steps.

Figure 2:
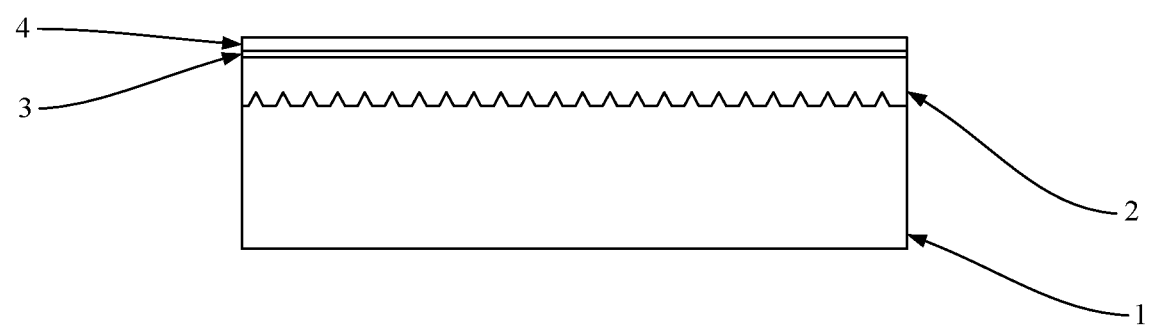
FIGS. 2 to 10 show cross-sectional views of different stages of a manufacturing method of the flip-chip LED according to the first embodiment of the present disclosure.

As shown in FIG. 2, an epitaxial layer is formed on a substrate 1, and comprises a first semiconductor layer 2, a light emitting layer 3 and a second semiconductor layer 4 arranged in sequence from bottom to top.

The substrate 1 may be made of sapphire, Si (silicon), SiC (silicon carbide), GaN (gallium nitride), ZnO (zinc oxide), etc. In this embodiment, the material of the substrate 1 is a sapphire ($Al_2O_3$) substrate having high light transmittance preferably. Further, the substrate 1 is a patterned sapphire substrate (PSS), and a standard photolithography process is performed to etch out a pattern of a mask on the surface of the substrate 1, and then the substrate 1 is etched by using ICP etching technology, so that patterned grooves are formed on the surface of the substrate 1 to improve luminous efficiency.

The material of the epitaxial layer is selected from any one or a combination of several of AlN, GaN, AlGaN, InGaN and AlInGaN, and in particular, a main material of the epitaxial layer is GaN preferably. More specifically, the epitaxial layer can be fabricated on the substrate by any one of existing known methods such as vapor deposition, evaporation, etc. In the epitaxial layer, the first semiconductor layer 2 is an N-type semiconductor layer, which is located on the substrate 1, and the material of the first semiconductor layer 2 is GaN. The light emitting layer 3 is located on the first semiconductor layer 2, and the light emitting layer 3 is constructed as a multiple quantum well layer, and the material of the quantum well layer is any one or a combination of several of AlN, GaN, AlGaN, InGaN and AlInGaN. The second semiconductor layer 4 is a P-type semiconductor layer located on the light emitting layer 3, and the material of the second semiconductor layer 4 is also GaN.

Figure 3:
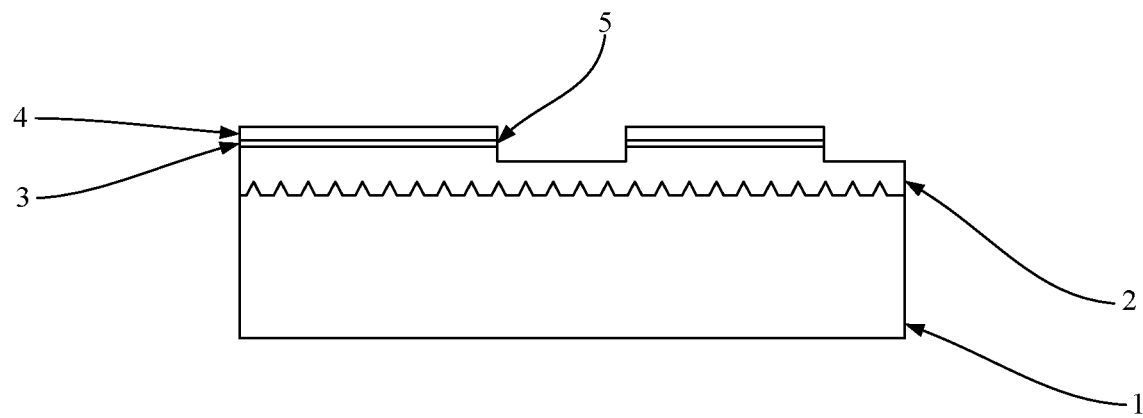

As shown in FIG. 3, the epitaxial layer is partially etched to form a mesa in the epitaxial layer, the mesa extends through the second semiconductor layer 4 and the light emitting layer 3 to the first semiconductor layer 2. By performing photolithography process, an MESA graphic of light emitting area is generated, and the mesa is formed by etching the epitaxial layer by use of an ICP (Inductive Coupled Plasma) etching equipment or by etching the epitaxial layer with BOE solution or HF solution. The etching stops at a depth deeper than the light emitting layer 3, i.e., multiple quantum well (MQW) layer, so that part of the first semiconductor layer 2 is exposed, a platform (seeing from a side view of the MESA) is etched out and the mesa is formed, wherein the mesa comprises an upper surface and a lower surface, the upper surface is provided by the second semiconductor layer, the lower surface is provided by the first semiconductor layer, and the upper surface and the lower surface are connected through a side surface 5 of the mesa formed between the upper surface and the lower surface of the mesa.

Figure 4:
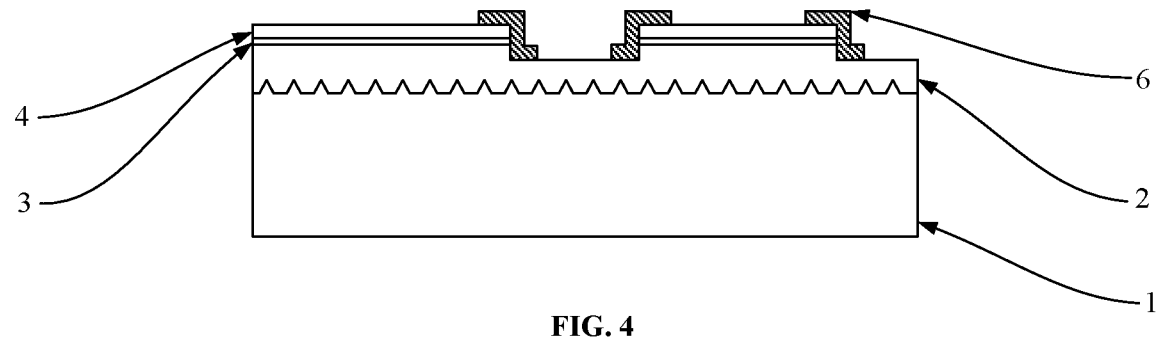

As shown in FIG. 4, a first insulating layer 6 is formed on the side surface 5 of the mesa, part of the upper surface, and part of the lower surface.

Preferably, the first insulating layer 6 is coated by performing PECVD (Plasma Enhanced Chemical Vapor Deposition) process, then a mask is made by using positive photoresist, and first openings are formed by etching the first insulating layer 6 by use of an ICP (Inductive Coupled Plasma) etching equipment or by etching the first insulating layer 6 with BOE solution or HF solution, so that part of the first semiconductor layer 2 and part of the second semiconductor layer 4 are respectively exposed by the first openings. A thickness of the first insulating layer 6 ranges from 0.01 um to 10 um, and in a further preferred embodiment, the first insulating layer 6 has a thickness of 0.5 um. The material of the first insulating layer 6 comprises at least one of silicon oxide and silicon nitride. A function of the first insulating layer is to protect the side surface of the mesa in advance from being polluted during long-term exposure to the air, thus avoiding failures on the cut-in voltage $VF_{in}$ and the leakage current IR.

Figure 5:
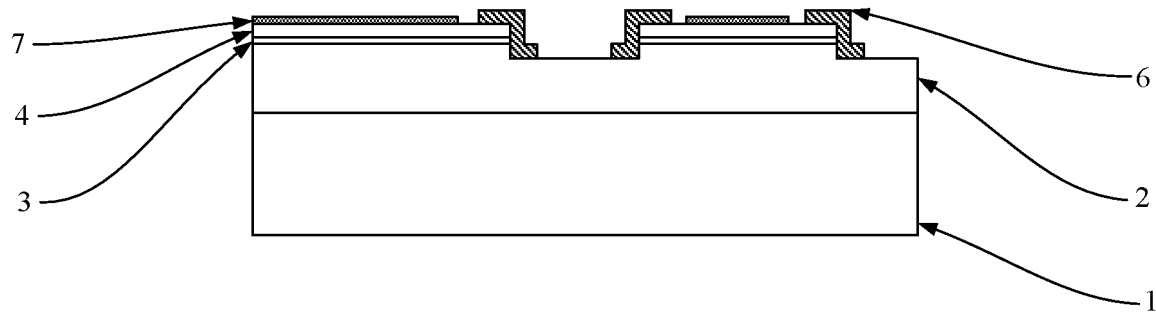

As shown in FIG. 5, a reflective layer 7 is formed on the second semiconductor layer 4.

The reflective layer 7 has a function of reflecting light, thus can reflect back the portion of light that is emitted towards the second semiconductor layer 4 from the light emitting layer 3. The reflective layer 7 comprises at least one of silver (Ag), aluminum (Al), and indium tin oxide (ITO), and preferably, the reflective layer 7 is a silver layer. Preferably, a mask pattern is formed by a negative photoresist lithography process, and then a thin film with high reflectivity is grown by electron beam evaporation, sputtering, ALD (Atomic layer deposition), etc., to form the reflective layer 7, and finally the mask and the thin film on the mask are removed by lift-off or other means. A thickness of the reflective layer 7 ranges from 0.1 um to 2 um, and in a further preferred embodiment, the reflective layer 7 has a thickness of 0.15 um. The reflective layer 7 and the side surface of the mesa are separated by a distance ranging from 0 um to 6 um, which is a vertical spacing in the horizontal direction between the reflective layer and the side surface of the mesa. Compared with the prior art which provides a large spacing between the reflective layer and the side surface of the mesa, since the first insulating layer is arranged in advance according to the present disclosure, the problem of pollution on the mesa is no longer needed to be considered, so that the distance between the reflective layer 7 and the side surface of the mesa can be greatly reduced, that is, the area of the reflective layer according to the present disclosure can be made larger, and better reflection effect can be realized at the same time.

Figure 6:
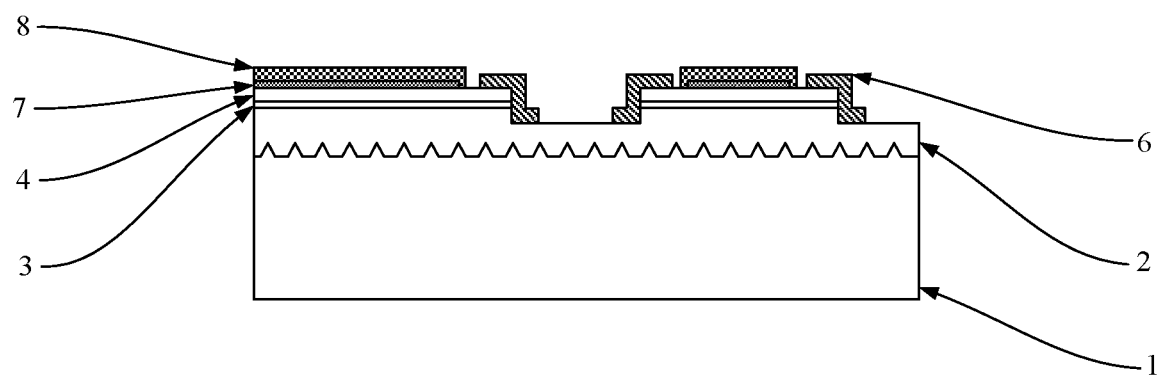

As shown in FIG. 6, a current spreading layer 8 is formed on the reflective layer 7.

The current spreading layer 8 protects the reflective layer 7, so as to avoid electric leakage caused by electron migration. Preferably, the mask pattern is formed by negative photoresist lithography process, and the current spreading layer 8 is grown by electron beam evaporation, sputtering, ALD, etc. Finally, the mask and the metal on the mask are removed by performing metal lift-off process and photoresist removing process. The material of the current spreading layer 8 comprises at least one of titanium (Ti), platinum (Pt), silver (Ag), aluminum (Al), nickel (Ni), chromium (Cr), and gold (Au). In addition to the function of protecting the reflective layer 7, the current spreading layer 8 also has a function of spreading current over its whole surface, so it is required to have a sufficient thickness. If the reflective layer is too thin, performance on current spreading may be poor. Preferably, the thickness of the current spreading layer 8 ranges from 0.5 um to 3 um, and in a further preferred embodiment, the current spreading layer 8 has a thickness of 1.4 um.

Figure 7:
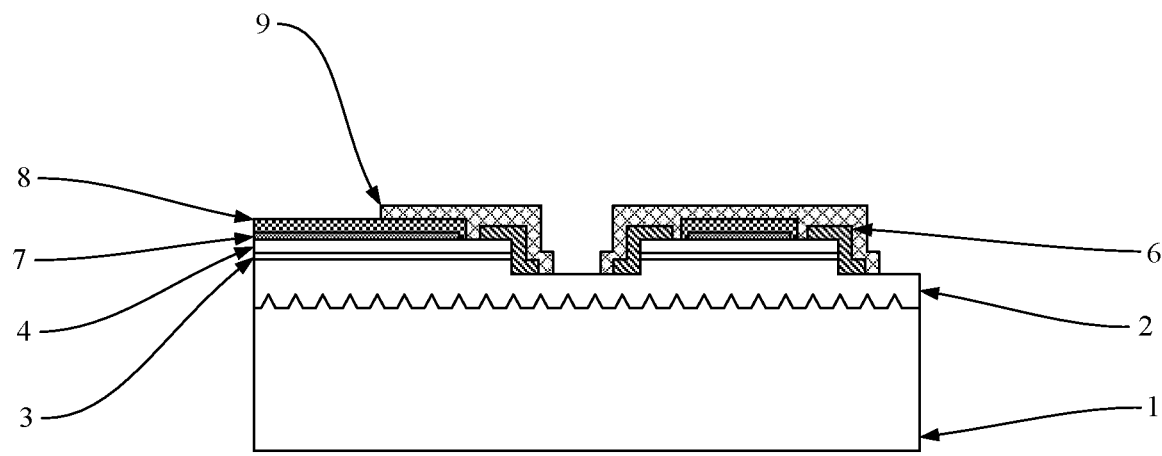

As shown in FIG. 7, a second insulating layer 9 is formed on the first insulating layer 6 and the current spreading layer 8. The second insulating layer 9 is preferably coated by performing plasma enhanced chemical vapor deposition (PECVD), and then a mask is made by using positive photoresist, and the second insulating layer 9 is etched by use of an ICP (Inductive Coupled Plasma) etching equipment or by BOE solution or HF solution to form second openings. A thickness of the second insulating layer 9 ranges from 0.01 um to 10 um, and in a further preferred embodiment, the second insulating layer 9 has a thickness of 1 um. The material of the second insulating layer 9 comprises at least one of silicon oxide and silicon nitride. Since the first insulating layer protects the side surface of the mesa in advance, the second insulating layer serves to insulate and protect the current spreading layer.

Figure 8:
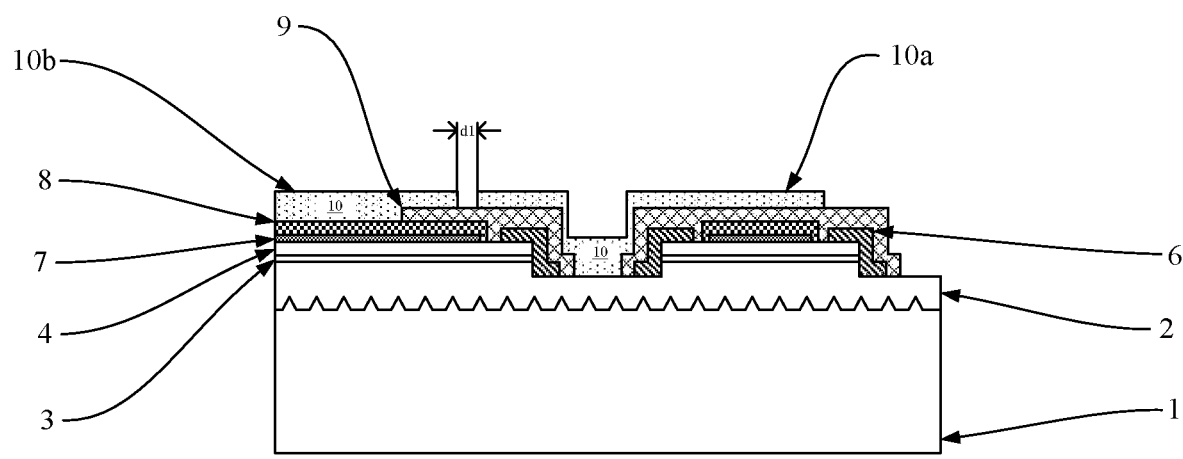

As shown in FIG. 8, a wiring layer 10 is formed on the second insulating layer 9, and covers the exposed portion of the first semiconductor layer and the exposed portion of the current spreading layer. The wiring layer 10 comprises a first metal layer 10a and a second metal layer 10b isolated from each other, wherein the first metal layer 10a is electrically connected to the exposed portion of the first semiconductor layer 2 and the second metal layer 10b is located on the current spreading layer 8 and electrically connected to the second semiconductor layer 4. The first metal layer 10a and the second metal layer 10b are separated by a distance d1 ranging from 5 um to 100 um in a horizontal direction, for separating the first electrode 12a and the second electrode 12b, such that the first electrode 12a and the second electrode 12b can be insulated from each other. A thickness of the wiring layer 10 ranges from 0.5 um to 3 um, and in a further preferred embodiment, the wiring layer 10 has a thickness of 1.4 um. The material of the wiring layer 10 comprises at least one of titanium (Ti), platinum (Pt), silver (Ag), aluminum (Al), nickel (Ni), chromium (Cr), and gold (Au). Preferably, the mask pattern of the wiring layer 10 is formed by negative photoresist lithography process, and then a metal layer film is grown by electron beam evaporation, sputtering, ALD, etc. Finally, the mask and the metal layer film on the mask are removed by performing metal lift-off process and photoresist removing process.

Figure 9:
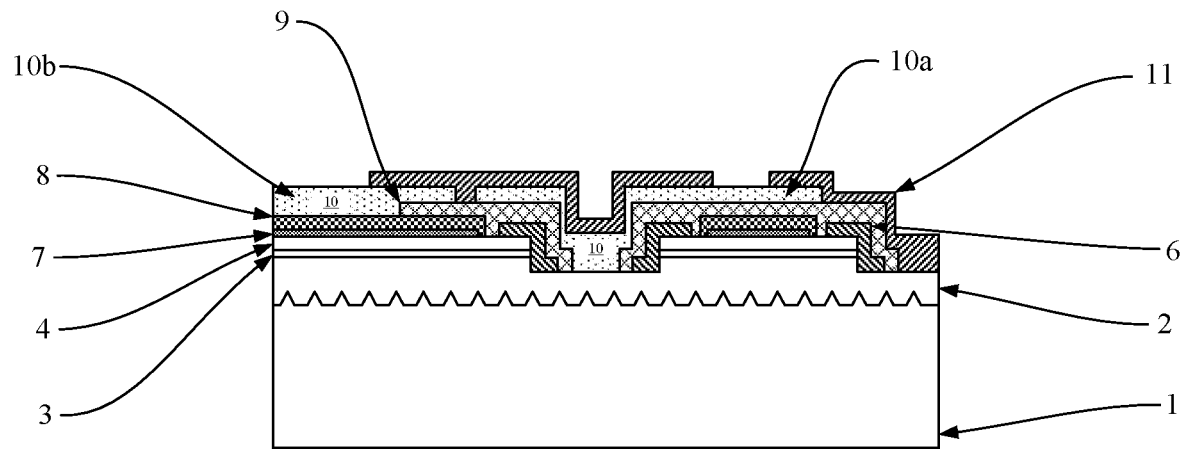

As shown in FIG. 9, a third insulating layer 11 is formed on the wiring layer 10. The third insulating layer 11 is etched to form third openings to respectively expose a portion of the first metal layer 10a and a portion of the second metal layer 10b. The third insulating layer 11 is preferably coated by performing plasma enhanced chemical vapor deposition (PECVD) process, then a mask is made by using positive photoresist, and the third insulating layer 11 is etched by use of an ICP (Induced Coupled Plasma) etching equipment or by BOE solution or HF solution to form the third openings. A thickness of the third insulating layer 11 ranges from 0.01 um to 10 um, and in a further preferred embodiment, the third insulating layer 11 has a thickness of 1 um. The material of the third insulating layer 11 comprises at least one of silicon oxide and silicon nitride.

Figure 10:
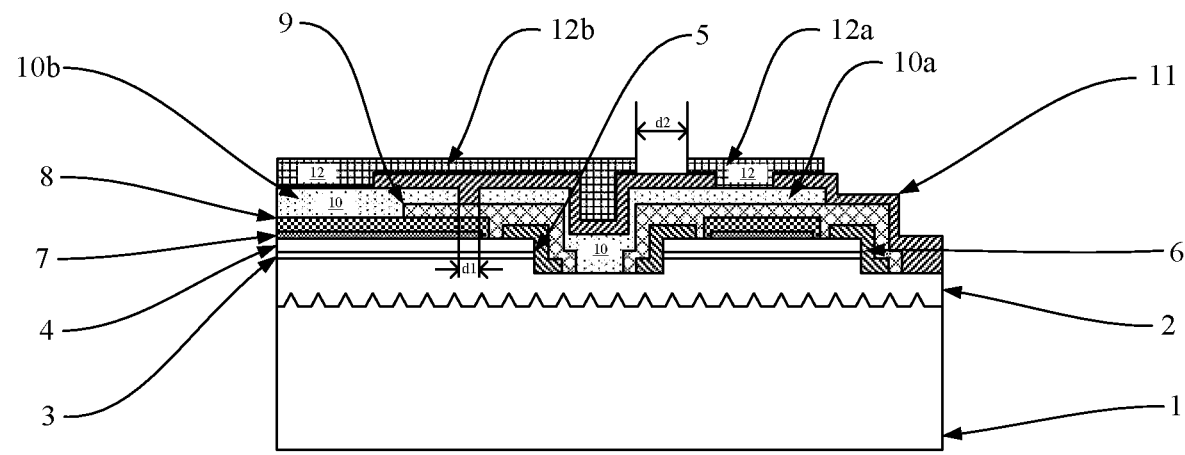

As shown in FIG. 10, a first electrode 12a electrically connected to the first semiconductor layer 2 is formed on the third insulating layer 11, a second electrode 12b electrically connected to the second semiconductor layer 4 is formed on the current spreading layer 8, and in particular, a second electrode 12b electrically connected to the second semiconductor layer 4 is formed on the second metal layer 10b and the third insulating layer 11, wherein the first electrode 12a and the second electrode 12b are isolated from each other. A patterned mask is formed by negative photoresist lithography process, and then a conductive metal film, such as at least one of titanium (Ti), platinum (Pt), silver (Ag), aluminum (Al), nickel (Ni), chromium (Cr), gold (Au), and gold-tin alloy (AuSn), is grown by electron beam evaporation, sputtering or ALD, to form the first electrode 12a and the second electrode 12b. Finally, the mask and the conductive metal film on the mask are removed by performing metal lift-off process and photoresist removing process. The first electrode 12a is an N-type electrode and the second electrode 12b is a P-type electrode. The first electrode 12a and the second electrode 12b are isolated from each other, and a distance between the first electrode and the second electrode ranges from 10 um to 300 um.

According to the manufacturing method of the flip-chip LED provided by the first embodiment of the present disclosure, an insulating layer covers the side surface of the mesa to protect the mesa immediately after the mesa is formed by etching, so that the mesa can be exposed to the air just for a short time, and be prevented from being contaminated by pollutants, such as metal, photoresist, photoresist stripper and the like, during subsequent processes, thus abnormal phenomena, such as electric leakage and poor ESD performance, can be avoided, and yield of the flip-chip LED can be improved.

Figure 11:
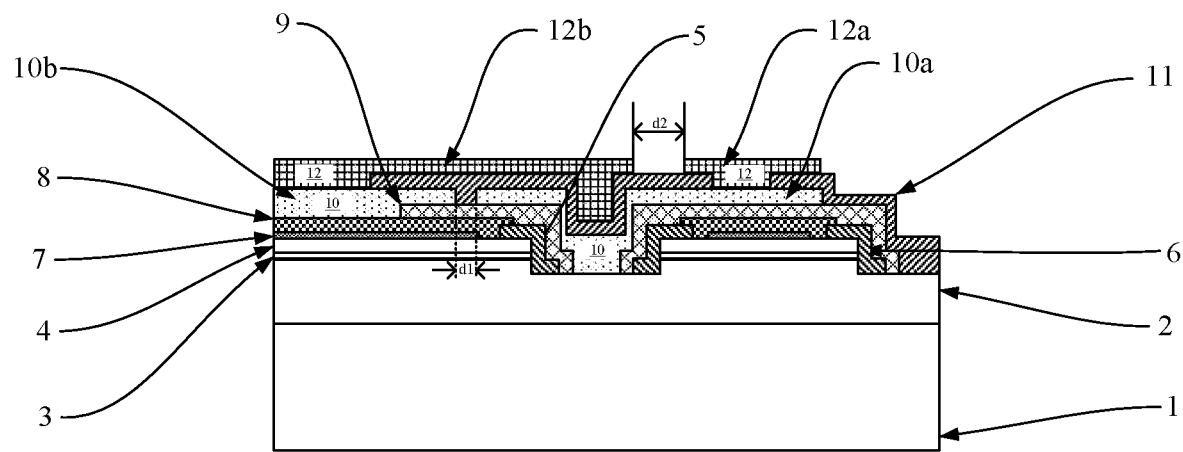
FIG. 11 shows a schematic diagram of a structure of a flip-chip LED provided according to a second embodiment of the present disclosure.

FIG. 11 shows a schematic diagram of a structure of a flip-chip LED provided according to a second embodiment of the present disclosure. Compared with the first embodiment, the current spreading layer 8 according to the second embodiment covers part of the first insulating layer 6.

Figure 12:
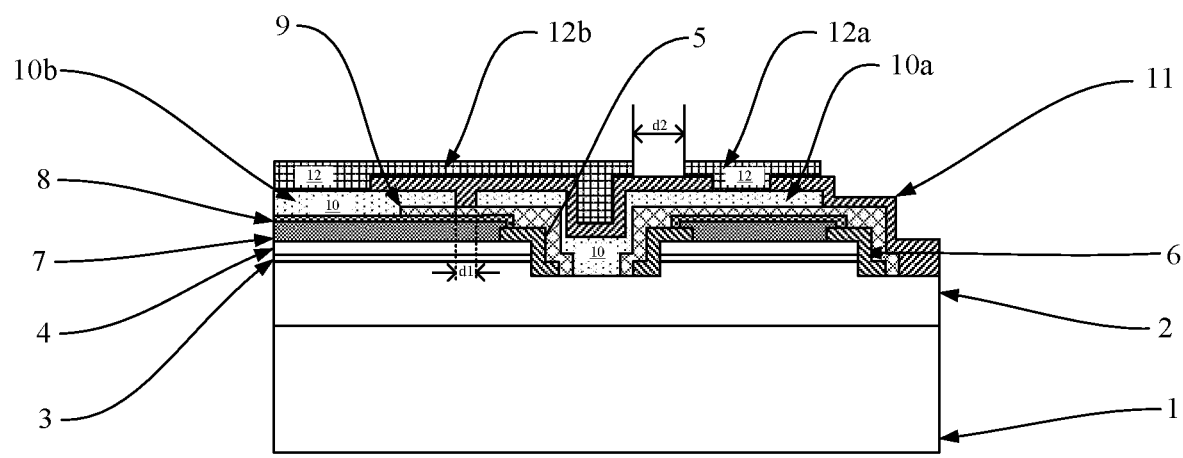
FIG. 12 shows a schematic diagram of a structure of a flip-chip LED provided according to a third embodiment of the present disclosure.

FIG. 12 shows a schematic diagram of a structure of a flip-chip LED according to a third embodiment of the present disclosure. Compared with the first embodiment, the reflective layer 7 and the current spreading layer 8 according to the third embodiment each cover part of the first insulating layer 6.

The embodiments in accordance with the present disclosure, as described above, are not described in detail, and are not intended to limit the present invention to be only the described particular embodiments. Obviously, many modifications and variations are possible in light of the above. These embodiments have been chosen and described in detail by the specification to explain the principles and embodiments of the present disclosure so that those skilled in the art can make good use of the present invention and the modified use based on the present invention. The invention is to be limited only by the scope of the appended claims and the appended claims and equivalents thereof.

What is claimed is:

1. A flip-chip LED, comprising:
a substrate;
an epitaxial layer, which is located on the surface of the substrate, and comprises a first semiconductor layer, a light emitting layer and a second semiconductor layer arranged in sequence from bottom to top;
a mesa, located in the epitaxial layer, wherein an upper surface of the mesa is provided by the second semiconductor layer, a lower surface of the mesa is provided by a first semiconductor layer, and the upper surface and the lower surface are connected through a side surface of the mesa formed between the upper surface and the lower surface;
a first insulating layer, covering the side surface of the mesa, part of the upper surface and part of the lower surface;
a reflective layer, located on the second semiconductor layer;
a current spreading layer, located on the reflective layer;
a first electrode, electrically connected with the first semiconductor layer; and
a second electrode, which is isolated from the first electrode, located on the current spreading layer, and electrically connected to the second semiconductor layer;
a second insulating layer, located on the first insulating layer and the current spreading layer,
wherein the first insulating layer has first openings respectively exposing part of the first semiconductor layer and part of the second semiconductor layer, and the second insulating layer has second openings respectively exposing part of the first semiconductor layer and part of the current spreading layer,
wherein the flip-chip LED further comprises:
a wiring layer, which is located on the second insulating layer, covers an exposed portion of the first semiconductor layer and an exposed portion of the current spreading layer, and is electrically connected with the first semiconductor layer and the current spreading layer, respectively;
wherein the wiring layer comprises a first metal layer and a second metal layer isolated from each other, the first metal layer is electrically connected with the first semiconductor layer, and the second metal layer is located on the current spreading layer and electrically connected with the second semiconductor layer.

2. The flip-chip LED according to claim 1, wherein a distance between the reflective layer and the side surface of the mesa adjacent to the reflective layer ranges from 0um to 6 um.

3. The flip-chip LED according to claim 1, wherein a thickness of the current spreading layer ranges from 0.5 um to 3 um.

4. The flip-chip LED according to claim 1, wherein the current spreading layer covers part of the first insulating layer.

5. The flip-chip LED according to claim 1, wherein the reflective layer and the current spreading layer each cover part of the first insulating layer.

6. The flip-chip LED according to claim 1, wherein a thickness of the first insulating layer ranges from 0.01 um to 10 um.

7. The flip-chip LED according to claim 1, wherein material of the first insulating layer comprises at least one of silicon oxide and silicon nitride.

8. The flip-chip LED according to claim 1, wherein material of the reflective layer comprises at least one of silver, aluminum, and indium tin oxide.

9. The flip-chip LED according to claim 1, wherein material of the current spreading layer comprises at least one of titanium, platinum, silver, aluminum, nickel, chromium, and gold.

10. The flip-chip LED according to claim 1, wherein a thickness of the reflective layer ranges from 0.1 um to 2 um.

11. The flip-chip LED according to claim 1, wherein a thickness of the second insulating layer ranges from 0.01 um to 10 um, and material of the second insulating layer comprises at least one of silicon oxide and silicon nitride.

12. The flip-chip LED according to claim 1, wherein the first metal layer and the second metal layer are separated by a distance ranging from 5 um to 100 um in a horizontal direction.

13. The flip-chip LED according to claim 1, wherein a thickness of the wiring layer ranges from 0.5 um to 3 um, and material of the wiring layer comprises at least one of titanium, platinum, silver, aluminum, nickel, chromium, and gold.

14. The flip-chip LED according to claim 1, further comprising:
a third insulating layer, located on the first metal layer and the second metal layer;
wherein, the third insulating layer has third openings, which respectively expose part of the first metal layer and part of the second metal layer.

15. The flip-chip LED according to claim 14, wherein the first electrode is located on the third insulating layer and electrically connected with the first metal layer through a corresponding one of the third openings;
and the second electrode is located on the third insulating layer and electrically connected with the second metal layer through another one of the third openings.

16. The flip-chip LED according to claim 14, wherein a thickness of the third insulating layer ranges from 0.01 um to 10 um, and material of the third insulating layer comprises at least one of silicon oxide and silicon nitride.

17. The flip-chip LED according to claim 1, wherein material of the first electrode and the second electrode is at least one of titanium, platinum, silver, aluminum, nickel, chromium, gold, and gold-tin alloy.

18. The flip-chip LED according to claim 1, wherein the first electrode and the second electrode are separated by a distance ranging from 10 um to 300 um in a horizontal direction.

19. The flip-chip LED according to claim 1, wherein the first semiconductor layer is an N-type gallium nitride layer, the second semiconductor layer is a P-type gallium nitride layer, the first electrode is an N-type electrode, and the second electrode is a P-type electrode.

20. The flip-chip LED according to claim 1, wherein the flip-chip LED includes a plurality of said mesa, the first metal layer has a projection toward the substrate, and the projection covers:
the first opening;
a portion of the first insulating layer and a portion of the second insulating layer;
a portion of the first semiconductor layer and a portion of the second semiconductor layer; and
a portion of the reflective layer and a portion of the current spreading layer that correspond to a corresponding one of the plurality of mesa in position.

21. The flip-chip LED according to claim 1, wherein a projection of the second electrode extends to a position corresponding to the first opening, through which the first metal layer is in direct contact with the first semiconductor layer, to allow the projection of the second electrode toward the substrate has a portion overlapped with the first metal layer.

22. The flip-chip LED according to claim 14, wherein a portion of the second metal layer is located between the third insulating layer and the second insulating layer, a portion of the first metal layer is located between the third insulating layer and the second insulating layer, and the third insulating layer is further arranged to insulate the portion of the second metal layer and the portion of the first metal layer.

* * * * *